(12) United States Patent
Ochiai et al.

(10) Patent No.: US 6,486,476 B1
(45) Date of Patent: Nov. 26, 2002

(54) SEMICONDUCTOR RADIATION DETECTOR AND MANUFACTURE THEREOF

(75) Inventors: Isao Ochiai, Otsuki; Kimio Kanda, Hitachi-naka, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/461,223

(22) Filed: Dec. 16, 1999

(30) Foreign Application Priority Data

Dec. 22, 1998 (JP) ............................................. 10-364064

(51) Int. Cl.[7] .............................. G01J 1/24; G01J 1/02; G01T 1/24; H01T 25/00
(52) U.S. Cl. ............................. 250/370.01; 250/370.09
(58) Field of Search ....................... 250/370.01, 214.1, 250/338.1, 370.09; 372/46; 438/57, 71; 257/431

(56) References Cited

U.S. PATENT DOCUMENTS

| | | | |
|---|---|---|---|
| 3,586,857 A | | 6/1971 | Glasow |
| 4,318,217 A | * | 3/1982 | Jenner et al. .................. 438/73 |
| 4,411,732 A | * | 10/1983 | Wotherspoon ......... 204/192.34 |
| 4,507,160 A | * | 3/1985 | Beck et al. .................. 438/477 |
| 4,521,798 A | * | 6/1985 | Baker .......................... 257/442 |
| 4,692,782 A | | 9/1987 | Seki et al. |
| 4,720,738 A | * | 1/1988 | Simmons ..................... 257/442 |
| 5,176,728 A | * | 1/1993 | Fugate et al. .................. 65/31 |
| 5,189,297 A | * | 2/1993 | Ahlgren ................... 250/214.1 |
| 5,268,578 A | | 12/1993 | Yeh |
| 5,446,751 A | * | 8/1995 | Wake ........................... 257/80 |
| 6,080,988 A | * | 6/2000 | Ishizuya et al. ............. 250/330 |

FOREIGN PATENT DOCUMENTS

| | | |
|---|---|---|
| GB | 1266431 | 3/1972 |
| JP | 8-5749 | 1/1996 |
| JP | 9-36410 | 2/1997 |
| JP | 9-92868 | 4/1997 |

* cited by examiner

Primary Examiner—Jack Berman
Assistant Examiner—Johnnie L Smith, II
(74) Attorney, Agent, or Firm—Mattingly, Stanger & Malur, P.C.

(57) ABSTRACT

The semiconductor radiation detector has a low leakage current, high radiation detecting efficiency and low cost. A high-density impurity layer of the detector is formed at least on one surface of a semiconductor crystal wafer beforehand. A crystal of a size required for forming the detector is diced from the wafer and the diced surfaces of the crystal have a mirror finished surface. A passivation film is formed on the diced surfaces of the crystal immediately after polishing.

14 Claims, 8 Drawing Sheets

SEMICONDUCTOR RADIATION DETECTOR AND MANUFACTURE THEREOF

BACKGROUND OF THE INVENTION

FIELD OF THE INVENTION

The present invention relates to a semiconductor radiation detector suitable for a device for irradiating a specimen with a charged particle such as an electron beam and x-ray, detecting characteristic x-ray generated from the specimen and analyzing the elements of the specimen and a device for irradiating a specimen with x-ray, detecting x-ray which is transmitted through or reflected from the specimen and analyzing the structure of the specimen, the manufacturing method and an apparatus of radiation detection using the above semiconductor radiation detector.

A method of irradiating a specimen with a charged particle such as an electron beam or x-ray, detecting characteristic x-ray generated from the specimen or fluorescent x-ray and analyzing the specimen is known. For its typical example, a method called energy dispersive x-ray spectroscopy of irradiating a specimen with an electron beam in an electron microscope, detecting characteristic x-ray generated from the specimen and analyzing the elements of the specimen can be given.

As characteristic x-ray or fluorescent x-ray has energy peculiar to an element composing a specimen, the number of the generation of x-ray per unit time to analyze elements is required to be counted every energy of x-ray. The energy dispersive x-ray spectroscopy is a method of using a detector wherein an output signal having height proportional to the energy of incident x-ray is acquired, identifying the energy of x-ray by combining the detector with a pulse-height analyzing circuit and analyzing elements.

For an x-ray detector used for the above energy dispersive x-ray spectroscopy, there is a semiconductor radiation detector (hereinafter simply called a detector) using a semiconductor crystal such as silicon and germanium.

An apparatus using these detectors and having energy resolution of approximately 140 eV for x-ray having energy of 5.9 keV is known. For the structure of a semiconductor radiation detector, three types of a pin-type, a pn-type and Schottky-barrier type (or a surface-barrier type) are known.

For a detector according to this type of energy dispersion method heretofore used, there is a detector produced by dispersing lithium in a silicon crystal called a lithium-drifted silicon detector.

Figure 7A:
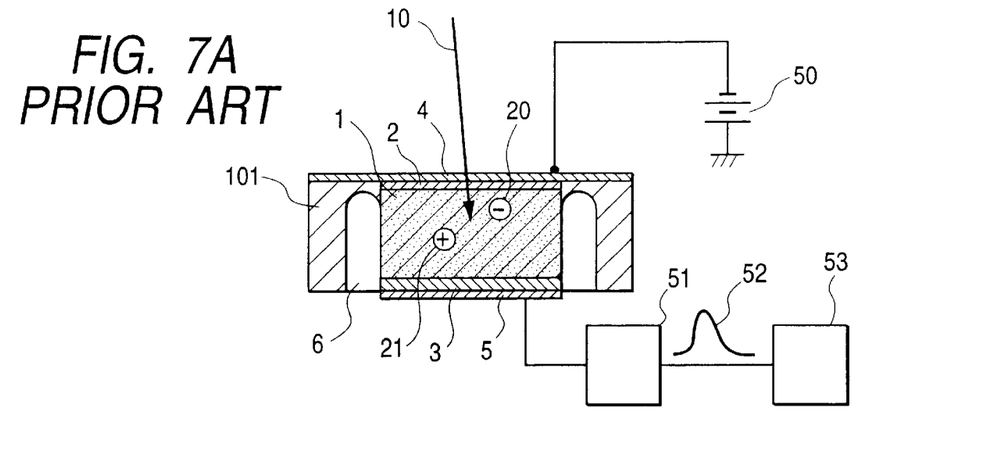
FIG. 7A is a schematic sectional view showing the conventional type radiation detector viewed along a line A–A' in FIG. 7B.
Figure 7B:
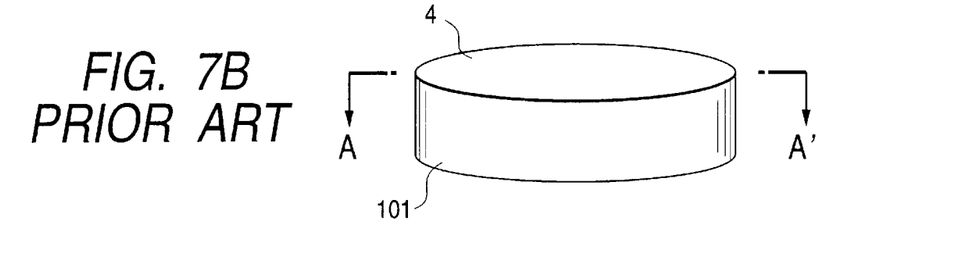
FIG. 7B is a perspective view showing the appearance of the conventional type radiation detector.

Of the above three types of detectors, for a first example, the typical contour of a pin-type detector is shown in FIG. 7A. FIG. 7A shows a cross section viewed along a line A–A' in FIG. 7B showing the appearance of the detector. The detector uses a p-type silicon crystal 101 and the outline is cylindrical and the detector has a concentric deep groove 6.

The pin-type has structure in which an intrinsic semiconductor region (an i layer) 1 formed by dispersing lithium in a semiconductor substrate 101 is held between a p-type layer 2 and an n-type layer 3 respectively formed on opposite surfaces, gold is respectively deposited on the surfaces of the p-type layer 2 and the n-type layer 3 and electrodes 4 and 5 are formed.

Negative voltage is applied to the electrode 4 on the p-type side of the detector by a bias supply 50 (reverse bias voltage is applied). Normally, x-ray is made incident from the surface of the electrode 4 on the p-type side. When x-ray 10 is incident upon the intrinsic semiconductor region 1, a secondary electron is generated and produces an electron-hole pair 20 and 21, losing energy. The generated electron 20 moves to the electrode 5 on the n-type side by an electric field between the electrodes 4 and 5.

The number of the generated electron-hole pairs is proportional to the energy of incident x-ray. The electron 20 which reaches the electrode 5 is converted to a voltage pulse 52 having height proportional to the number by an amplifier 51 and the energy of x-ray is identified by a pulse-height analyzer 53.

Reverse bias voltage applied to the electrodes 4 and 5 is set to high voltage of approximately 1000 V to prevent an electric charge (the electron-hole pair 20 and 21) generated in the intrinsic semiconductor region 1 from being recombined and from being annihilated.

To acquire high energy resolution for the ability of a detector, it is required to reduce leakage current which flows in a detector when reverse bias voltage is applied down to 100 fA or less and to reduce the capacitance of the detector. Therefore, a detector is housed in a vacuum container, is cooled by liquid nitrogen and others, leakage current thermicly generated is reduced by keeping the detector at low temperature and further, surface leakage current is reduced by the concentric deep groove 6.

The capacitance of a detector is in inverse proportion to the thickness of the intrinsic semiconductor region 1 and is proportional to area S. The area S means the cross section of a part (the intrinsic semiconductor region 1) inside each groove 6 and is a sensitive part to x-ray. The thickness of the intrinsic semiconductor region 1 is set to approximately 3 to 5 mm.

In the case of a silicon detector, characteristic x-ray having energy of approximately 20 keV with the above thickness can be detected efficiently. For area S, a silicon detector having area of 10 to 30 mm$^2$ is known. If area is further large, capacitance is increased and energy resolution required for analyzing elements is not acquired. If area is 20 mm$^2$, that is, the diameter inside each groove 6 is approximately 5 mm, a silicon detector having the outside diameter of approximately 11 mm is known.

Next, in a pn-type detector for a second example, an n-type layer or a p-type layer of high density is formed on the surface including a p-type or an n-type semiconductor crystal in place of the above intrinsic semiconductor region 1 to produce pn junction and the above detector utilizes a depletion layer generated by applying voltage in a reverse direction. The high-density same-type layer is formed on each opposite surface and further, each electrode is formed on the layer.

When x-ray is incident on the depletion layer in a state in which reverse bias voltage is applied between these both electrodes and the depletion layer is generated in pn junction, an electron-hole pair 20 and 21 are generated and the electron 20 moves on the side of the electrode 5 by an electric field generated in the depletion layer as in the intrinsic semiconductor region 1 of the pin-type detector shown in FIG. 7A.

Also, for a third example, a detector utilizing a depletion layer generated by applying voltage to Schottky barrier formed by forming a metal electrode on the surface of a semiconductor substrate by gold and others in a reverse direction is called Schottky-barrier type detector (or a surface-barrier type detector). The thickness of a depletion layer is proportional to the square root of applied voltage and is in inverse proportion to the square root of the density of impurities in a crystal. To acquire a depletion layer 3 mm thick by applied voltage of 1000 V, a crystal of higher purity by 3 or 4 digits is required, compared with a crystal used for producing a normal transistor and a normal integrated circuit.

As for Schottky-barrier type detector, to acquire a depletion layer 3 mm thick by applied voltage of 1200 V as an example of the numerical value, a crystal of the purity of approximately $5 \times 10^{11}$ pieces per 1 cm$^3$ in the density of impurities is required. As recent crystal manufacturing technology is developed, a crystal of high purity which meets the above specification can be manufactured and is actually utilized.

As for a heretofore used lithium-drifted silicon detector, as lithium is thermally diffused when the detector is left at room temperature for a long time and has a bad effect upon the characteristics of the detector such as capacitance increases, the detector is said to be always kept at low temperature, however, each type detector shown in these first to third examples using a high-purity crystal is not required to be always kept at low temperature.

Figure 8A:
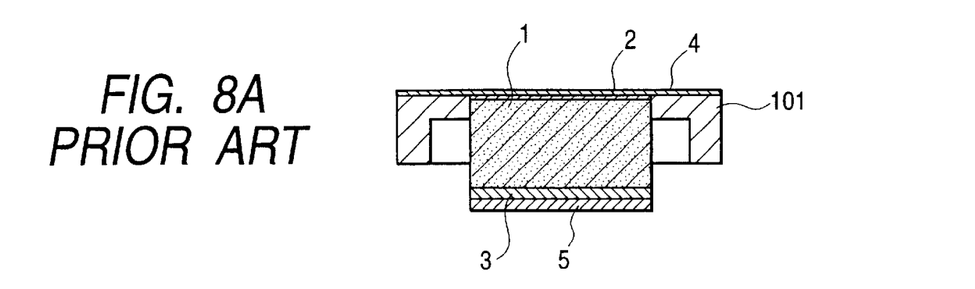
FIG. 8A is a schematic sectional view showing another conventional type radiation detector viewed along a line A–A' in FIG. 8B.
Figure 8B:
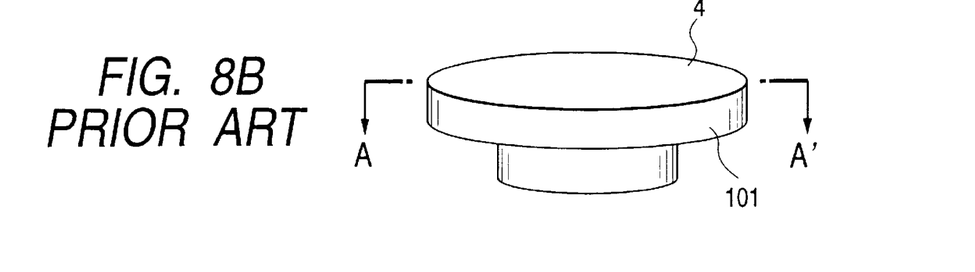
FIG. 8B is a perspective view showing the appearance of another conventional type radiation detector.
Figure 9A:
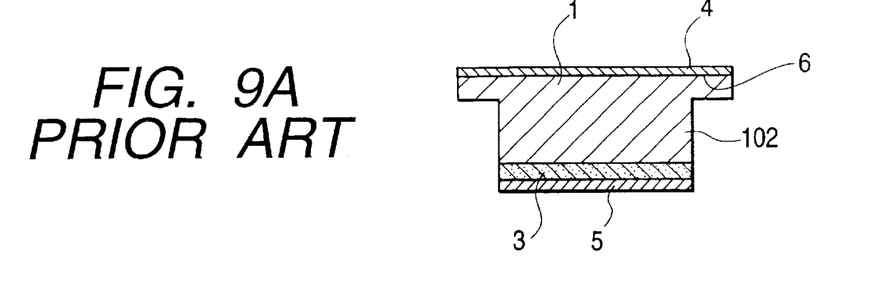
FIG. 9A is a schematic sectional view showing the other conventional type radiation detector viewed along a line A–A' in FIG. 9B.
Figure 9B:
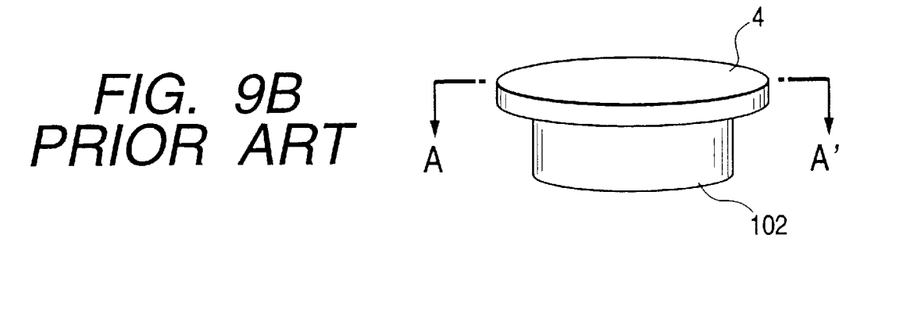
FIG. 9B is a perspective view showing the appearance of the other conventional type radiation detector.

For the contour of a detector, a detector having a contour in which the thickness of a periphery outside a groove is thinned and shown in FIGS. 8A and 8B and a detector provided with a cylindrical brim and shown in FIGS. 9A and 9B are known as disclosed in the U.S. Pat. No. 5,268,578 except the contour provided with the deep groove 6 shown in FIG. 7A. There is effect that leakage current is reduced in both contours. These groove and brim are formed by machining with a supersonic wave and further chemical etching of the machined surface.

Figure 10:
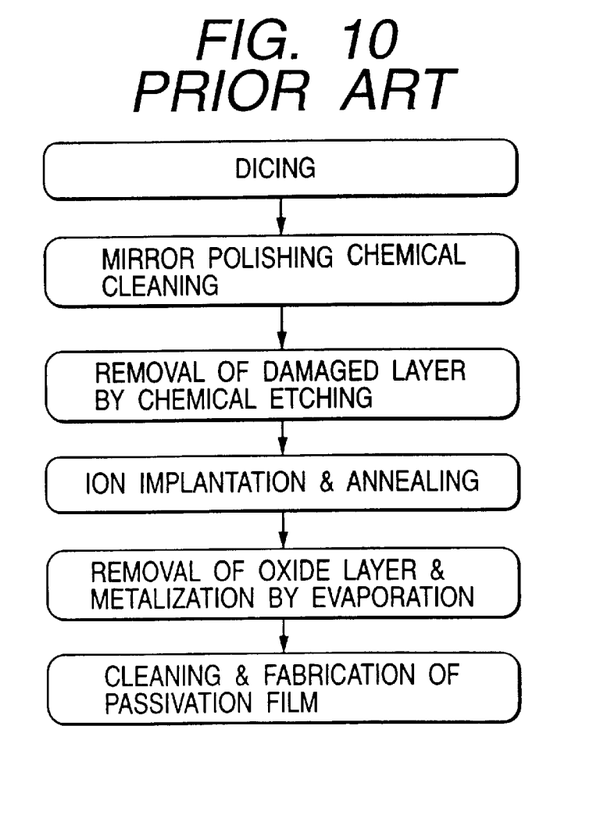
FIG. 10 is a flowchart for explaining the manufacturing process of the conventional type radiation detector.

Further, as disclosed in Japanese Patent Laid-Open No. 9-92868 formerly proposed by these inventors, there is a polygonal detector manufactured by a process shown in FIG. 10 wherein leakage current is reduced by adopting a mirror finished and polished surface.

The outline of each process for manufacturing the above detector according to a manufacturing process shown in FIG. 10 will be described below.

First, there is a process for dicing a rectangular parallel-epipedic specimen (crystal) for example from a wafer to produce the detector.

Next, there are a process for polishing the surface of the crystal a mirror finished surface and a process for removing a minute damage due to polishing by etching.

Next, there is a process for doping n-type or p-type impurities in the crystal by ion implantation and annealing it and there is a process for removing an oxide film (a natural oxide film) on the surface of the crystal, depositing metal for forming an electrode on the surface and on the back of the specimen and forming a diode.

Finally, there is a process for forming an insulating passivation film on the whole specimen except the surface of the electrode after the surface of the specimen is cleaned.

Figure 11A:
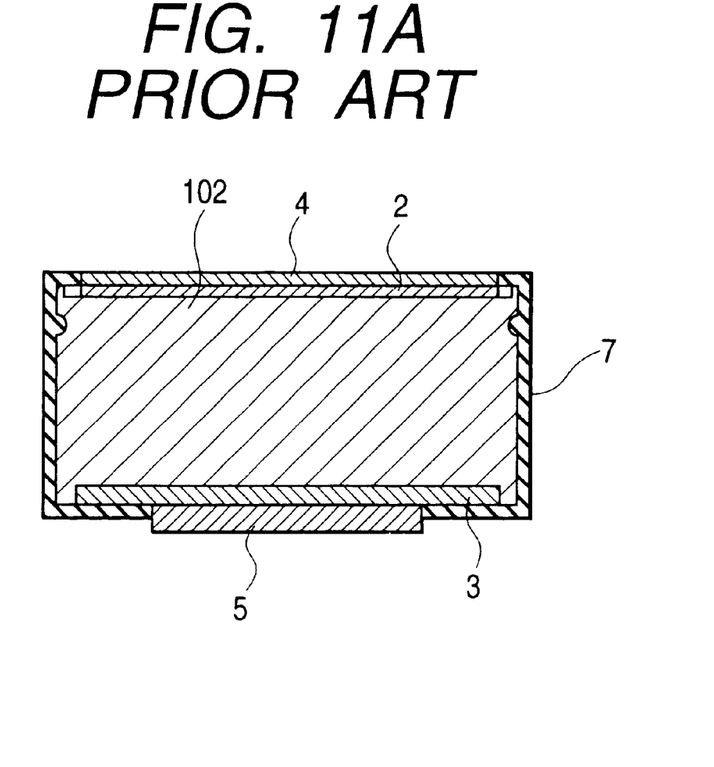
FIG. 11A is a sectional view showing the appearance of a conventional type pin-type semiconductor radiation detector viewed along a line A–A' in FIG. 11B.
Figure 11B:
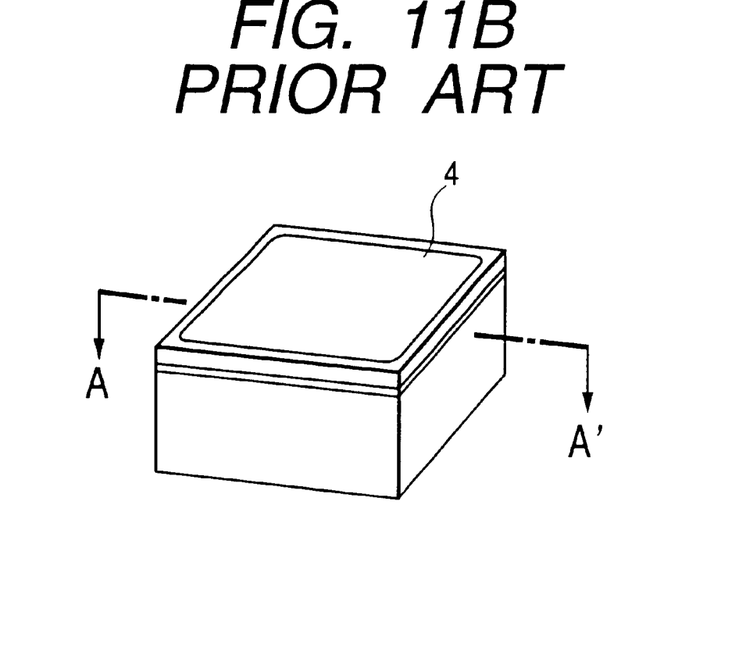
FIG. 11B is a perspective view showing the appearance of the conventional type pin-type semiconductor radiation detector.

The outside drawing of an example (a pin-type detector) of a detector acquired as described above is shown in FIG. 11B and a cross section viewed along a line A–A' in FIG. 11B is shown in FIG. 11A. As shown in FIG. 11, a reference number 102 denotes a high-purity n-type silicon crystal, 2 denotes a p-type layer, 3 denotes an n-type layer, 4 and 5 denote an electrode and 7 denotes a polyimide passivating film.

Figure 12:
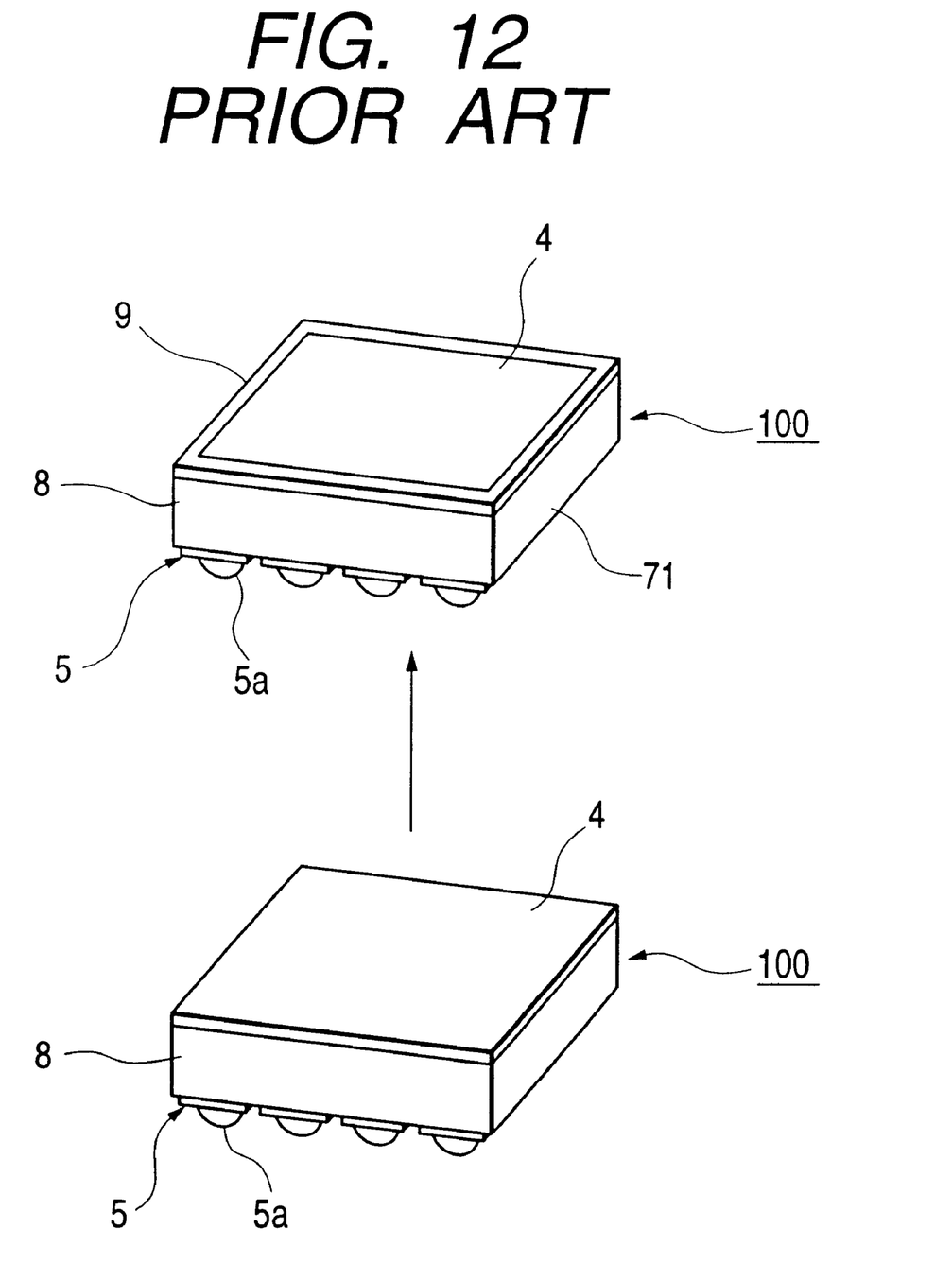
FIG. 12 is a sectional view showing the appearance of a conventional type semiconductor radiation detector.

For the other documents related to the formation of the passivating film 7, Japanese Patent Laid-Open No. 9-36410 for example can be given. In the case of the example, a passivating film is also formed in a final manufacturing process after an electrode is formed on the surface and on the back of a detector. That is, as shown in FIG. 12, in a final manufacturing process after a common electrode 4 and individual electrodes 5 are formed on the surface and on the back of a detector 100, the side (the end face) 8 of the detector 100 and the periphery 9 except the main surface which functions as the light receiving surface of the above common electrode 4 are covered with an insulating film (an oxide film) in the shape of a frame. In this example, a solder bump 5a is formed on the surface of the individual electrode 5 on the back.

However, as for two structures described in the first and second examples of the above detector, there are problems that a semiconductor crystal is required to be cut cylindrically as shown in FIG. 7A, a deep groove is required to be formed, difference in a level is required to be made on the side on which a groove is formed as shown in FIG. 8A, control in the dimension of these grooves and the control of a surface state of the groove are difficult, a manufacturing yield is bad, work is complex and a product is high-priced.

Also, further, there are problems that if plural detectors are arranged to enhance sensitivity in detecting x-ray, it is difficult to enhance mounting density because the cross section of each detector is circular and the area of a part sensitive to x-ray is small, compared with the outer cross section of the detector because ineffective areas such as a groove and a brim are provided. The above area is hereinafter called effective area. Further, a detector the cross section of which is not circular is also known, however, there is a problem that the machining of a groove and a brim is more complicated.

Also, as the process flowchart as prior art shown in FIG. 10 and the pin-type detector shown in FIGS. 11A and 11B, a polygonal detector adopting mirror polishing is characterized in that as the contour is simple, the manufacture is simple and a large effective area ratio is obtained. However, the yield of a product where leakage current 100 fA or less is generated by the application of reverse bias voltage of 1000 V is at most approximately 2%. Particularly, the yield in the case of Schottky-barrier type detector described as the above third example is low. In most Schottky-barrier type detectors, the typical value of voltage at which leakage current rapidly increases, breakdown starting voltage is approximately 200 V. Therefore, there is a problem that it is difficult to manufacture an actually usable detector.

When this type of detector is manufactured by prior art, a manufacturing method of forming a passivating film in a required part of the detector as a final process after a diode is completed via a process for diffusing impurities and a process for forming an electrode respectively required for a detector has been customarily adopted as to any detector of a pin type, a pn type and Schottky-barrier type.

Also, when this type of detector is manufactured, there is a problem that the following process is troublesome because an impurities diffusing process is executed every semiconductor crystal diced from a wafer.

SUMMARY OF THE INVENTION

Therefore, a first object of the present invention is to enable setting voltage at which leakage current rapidly increases, breakdown starting voltage to a still higher value than conventional 200 V and to provide a reliable semiconductor radiation detector.

A second object is to provide a manufacturing method of an improved semiconductor radiation detector wherein a detector the leakage current of which is 100 fA or less is acquired at the yield of at least 90% even if reverse bias voltage of at least 1000 V is applied.

A third object is to provide an apparatus of radiation detection provided with a semiconductor radiation detector the leakage current of which is 100 fA or less even if reverse bias voltage of at least 1000 V is applied.

The above first object is achieved by a semiconductor radiation detector characterized in that an insulating passivation film covers the side of a crystal and is provided except a main part of an electrode formed region formed on the surface and on the back of the semiconductor crystal and in the vicinity of the periphery of the main part so that the insulating passivation film surrounds the above periphery, at least an electrode on the side of a light receiving part is expanded from the main part of the electrode formed region of the semiconductor crystal so that the above electrode covers the periphery of the insulating passivation film and both peripheries are overlapped and laminated based upon a semiconductor radiation detector provided with diode structure configured by an electrode respectively provided on the surface and on the back of a semiconductor crystal, an insulating passivation film covering at least the side of the crystal of the above diode structure, a light receiving part configuring the main part of the surface electrode in the diode structure and a signal output part for outputting a signal generated in the diode structure from the electrode on the back as a detection signal when a radiation is incident on the light receiving part in a state in which reverse bias is applied between both electrodes.

As for the configuration of the detector according to the present invention, any radiation detector of a pin type, a pn type and Schottky-barrier type is effective, however, particularly Schottky-barrier type detector is the most effective.

A semiconductor crystal is represented by silicon, however, a compound semiconductor crystal may be also used and generally, a well-known semiconductor crystal used for a detector can be used.

As for an insulating passivation film, an organic insulating film formed by polyimide and others is desirable because the organic insulating film is easy to form its pattern, however, an inorganic insulating passivation film may be also formed by $SiO_2$ and others by well-known chemical vapor deposition (CVD).

The detector according to the present invention which is the second object can be easily acquired by a manufacturing method described below.

A process in the manufacturing method according to the present invention is characterized in that first, after both surfaces of a wafer are polished, impurities required for the configuration of the detector are doped inside the wafer after a process for removing a damaged layer caused by a cleaning process and polishing on the wafer and removing a natural oxide film formed on the surface of the wafer by cleaning using hydrofluoric acid and others. The above process is also characterized in that a crystal in size required for forming the detector from the wafer into which the impurities are doped is diced in the shape of a cube for example for a later detector manufacturing process.

Hereby, multiple crystal specimens for forming the detector into which the required impurities are doped under the same condition can be prepared at a time.

Heretofore, the doping of impurities into a wafer has been individually executed for a diced specimen after the wafer is diced into a crystal in size required for forming the detector.

Second, the process in the manufacturing method according to the present invention is characterized in that the timing (the order) of the process for forming an electrode on the surface and on the back of a crystal specimen for forming the detector into which impurities are doped is shifted to a final process after the process for forming the insulating passivation film and electrode structure on the side of the light receiving part is improved.

As described above, heretofore, after an electrode is formed on a crystal specimen for forming the detector into which impurities are doped beforehand, the insulating passivation film is customarily formed on the surface of the detector except the electrode as a final process. However, the voltage at which leakage current generated when reverse bias voltage is applied rapidly increases (breakdown starting voltage) of the detector manufactured according to the above process is 200 V and is low.

These inventors performed various experiments and examined them to enable setting the above breakdown starting voltage to a higher value than 200 V. As a result, unexpectedly when the above process for forming the electrode is shifted after the process for forming the insulating passivation film to be a final process of manufacturing the detector and electrode structure on the side of the light receiving part is improved as described later, the above breakdown starting voltage is remarkably enhanced and unexpected characteristics exceeding conventional 200 V by far are acquired.

Also, a fact that a detector the leakage current of which is 100 fA or less even if reverse bias voltage of at least 1000 V is applied can be acquired at the yield of at least 90% becomes apparent.

The process for forming the insulating passivation film and the process for forming the electrode according to the present invention will be described in detail below.

To explain the process for forming the insulating passivation film, first, a crystal specimen used for this process is prepared via the following preparation process. That is, at least the side of a crystal specimen diced from a wafer for forming the detector is polished a mirror finished surface and further, etching processing is executed to remove a damaged layer by the above polishing.

In a process for polishing to be a mirror finished surface, in the case of Schottky-barrier type detector, a layer where impurities are diffused on the back of a specimen is left without being polished, the side is polished and a layer where impurities are diffused on the surface to be the light receiving part is also polished and is removed. If a pin-type detector and a pn-type detector are formed, only the side is polished and both the front surface and the back on which an electrode is formed are not polished.

In an etching process, an electrode formed region on the surface and on the back is covered with a resist film if necessary. That is, in the case of Schottky-barrier type detector, a resist film (a photoresist film) is formed in only an electrode formed region on the back of a specimen and the other surface is etched, protecting an impurity diffusion layer. If a pin-type detector and a pn-type detector are formed, only the side is etched, protecting an electrode formed region both on the surface and on the back with a resist film.

The specimen to which etching processing is applied as described above is cleaned by an organic solvent if necessary, further, is cleaned by inorganic aqueous solution such as hydrofluoric acid and the surface of the specimen is cleaned. If a resist film is used in etching processing, the specimen is cleaned by an organic solvent to remove a residue of an organic matter. A natural oxide film generated on the surface of the specimen is removed by cleaning using inorganic acid aqueous solution.

An insulating passivation film is formed on the surface of the specimen the surface of which is cleaned via the above processing. The insulating passivation film is continuously provided from the whole area of the side of the specimen to the periphery close to the side except the main part of the electrode formed region formed both on the surface and on the back of the specimen.

For the insulating passivation film, an organic insulating film formed by polyimide resin and polyamide resin is desirable and can be easily formed by applying resin solution to a specimen. Besides, an inorganic insulating passivation film such as $SiO_2$ may be also formed by well-known CVD.

Next, the process for forming an electrode will be described. An electrode is respectively formed on the front surface and on the back of the above specimen on which the insulating passivation film is formed as a final manufacturing process. The electrode on the side of the light receiving part is laminated so that the above electrode on the side of the light receiving part covers from the electrode formed region which is surrounded by the insulating passivation film on the surface of the specimen and inside which a crystal is exposed (the main part of the electrode formed region) to the periphery of the insulating passivation film.

As described above, in the present invention, structure in which the periphery of the electrode on the side of the light receiving part covers the periphery of the insulating passivation film and both peripheries are overlapped is guessed one of reasons why excellent characteristics that electrostatic focusing is relaxed and thereby, breakdown starting voltage exceeds conventional 200 V by far are acquired.

As the surface of a specimen is cleaned and an electrode is formed in a state in which the insulating passivation film is formed, the following particulate adheres to the insulating passivation film and does not directly adhere to the surface of a crystal directly and even if a particulate of electrode material is dispersed on the side of the specimen in the process for forming an electrode and adheres and as a result, it is guessed that the deterioration of the characteristics is remarkably reduced.

According to the manufacturing method, as the insulating passivation film is previously formed and an electrode is formed afterward, it is easy to cover the periphery of the insulating passivation film with the periphery of the electrode on the side of the light receiving part and the degree of the overlap of both peripheries can be arbitrarily controlled by arbitrarily selecting the size of an electrode pattern.

It is desirable that an electrode on the back of a specimen also has the same contour as the electrode on the side of the light receiving part, however, as heretofore, the periphery of the insulating passivation film and the periphery of the electrode may be also close in place of laminated structure that the periphery of the insulating passivation film is covered.

These electrodes can be easily formed by well-known film formation technology such as deposition, sputtering and CVD and pattern formation technology by lithography.

For electrode material, at least one kind of gold, palladium and aluminum is used for desirable material.

The third object of the present invention is achieved by applying the semiconductor radiation detector acquired as described above to an apparatus of radiation detection having well-known configuration. That is, as the above apparatus of radiation detection is provided with the semiconductor radiation detector the leakage current of which is 100 fA or less even if reverse bias voltage of at least 1000 V is applied, a reliable apparatus of radiation detection which is sensitive in radiation detection can be realized.

The present invention is made based upon the above experiments and the details of the contents of the experiments will be described in embodiments.

DETAILED DESCRIPTION OF THE PREFERRED EMBODIMENTS

First Embodiment

Figure 1A:
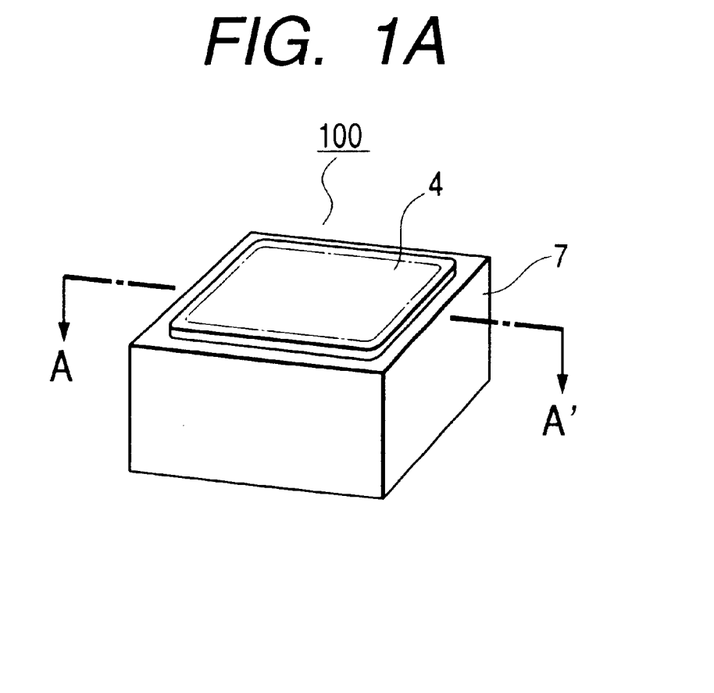
FIG. 1A is a perspective view showing the appearance of Schottky-barrier type radiation detector equivalent to one embodiment of the present invention.
Figure 1B:
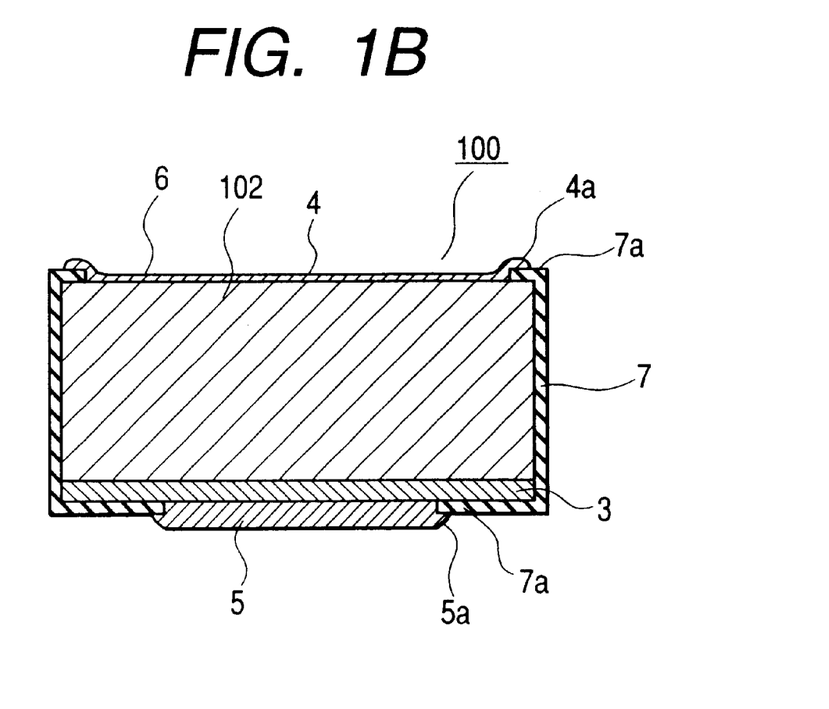
FIG. 1B is a sectional view showing the cross section viewed along a line A–A' in FIG. 1A.

Referring to FIGS. 1A and 1B, an example in which the present invention is applied to Schottky-barrier type semiconductor radiation detector (hereinafter called a detector) will be described below.

FIG. 1B is a sectional view showing the structure of the above detector 100. An electrode 4 20 nm thick on the side on which a radiation is incident configuring a light receiving part is formed on the surface of a square high-purity n-type silicon crystal 102 7 mm square. At the interface between silicon crystal 102 and the electrodes 4, a Schottky barrier 6 is formed. A back contact 5 0.5 μm thick and a high-density n-type diffused layer 3 for acquiring ohmic contact (dopant is phosphorus (P): the density of diffusion is $1 \times 10^{15}/cm^3$: the depth of diffusion is 0.75 μm) are formed on the back.

A polyimide insulating passivation film 7 10 to 100 μm thick is coated from the side of the crystal 102 to each periphery of the electrodes 4 and 5. As shown in FIG. 1, the periphery 7a of the insulating passivation film 7 close to each periphery of these electrodes is covered with the periphery 4a, 5a of each electrode.

To explain an example of the electrode 4 on the side on which a radiation is incident configuring the light receiving part, the periphery 7a of the insulating passivation film 7 formed around an insular electrode formed region is covered with the periphery 4a of the electrode 4 and both peripheries 7a and 4a are mutually overlapped and laminated structure is formed.

Referring to a flowchart shown in FIG. 2 and a schematic drawing showing a fixer used for manufacture shown in FIG. 3, the manufacturing method of the detector will be described below.

Figure 2:
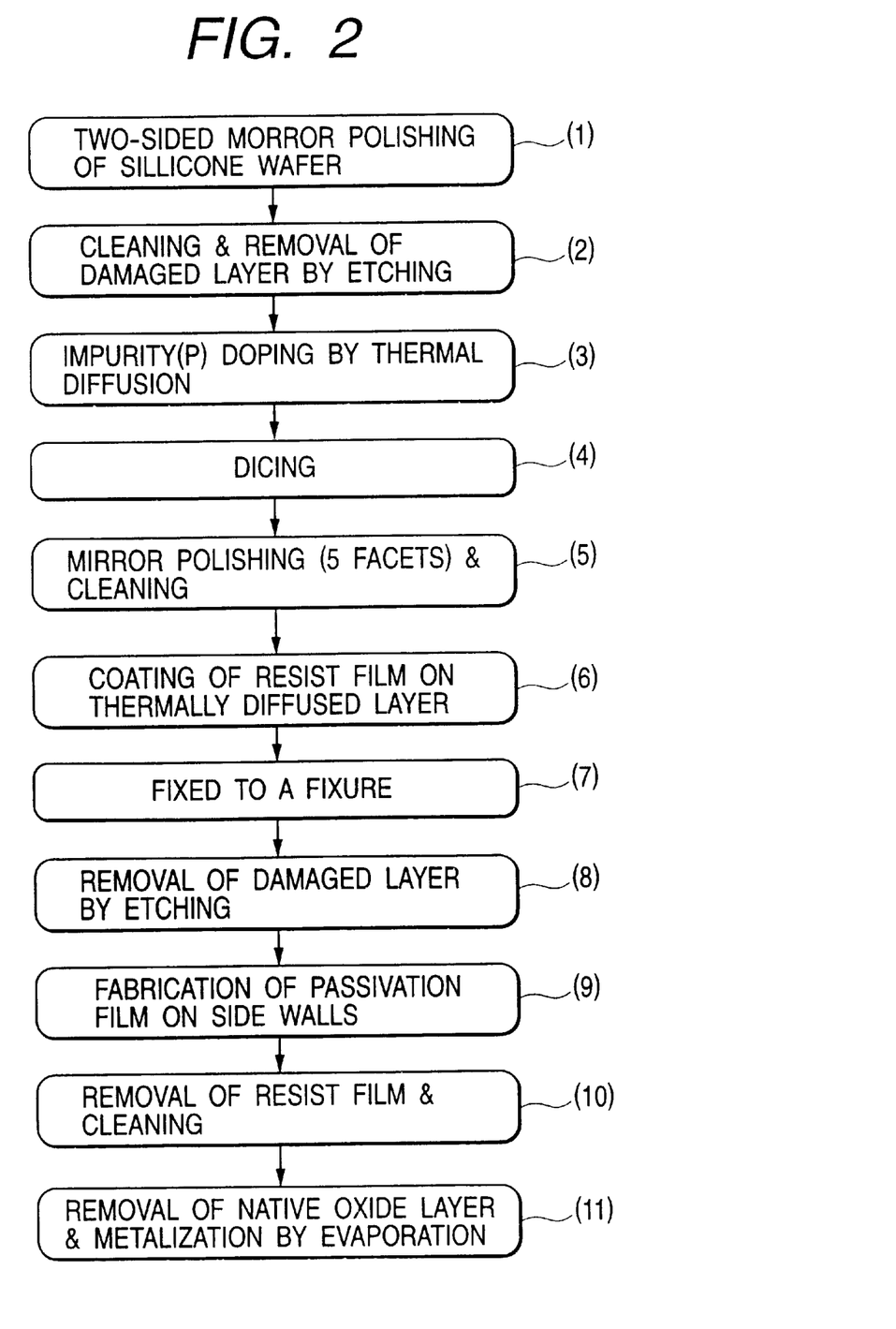
FIG. 2 is a flowchart for explaining the manufacturing process of Schottky-barrier type radiation detector according to the present invention.

As shown in the flowchart in FIG. 2, first, (1) as a first process, a wafer 3 mm thick and 2 inches in diameter the orientation of the crystal face of which is (111) and which is diced from an ingot of a high-purity n-type silicon crystal the resistivity of which is approximately 50 kΩcm is used. Both surfaces of the diced wafer are polished to be a mirror finished surface.

(2) As a second process, the wafer both surfaces of which are polished is cleaned by an organic solvent (acetone), is cleaned by mixed liquid of sulfuric acid and hydrogen peroxide and is cleaned by aqua regia to remove materials contaminating the surface such as an organic material and heavy metal. Further, a damaged layer by polishing is removed by etching using mixed liquid of acetic acid, hydrofluoric acid and nitric acid. The quantity of etching is approximately 50 mm.

(3) As a third process, phosphorus (P) is diffused inside the surface of the wafer by putting the wafer in a thermal diffusion furnace using oxygen and gaseous nitrogen as carrier gas and a high-density n-type layer 3 is formed. The high-density n-type layer 3 is provided to acquire ohmic contact with the electrode to be formed later. The density of diffusion is $1 \times 10^{15}/cm^3$ or more and the depth of diffusion is 0.75 μm.

(4) As a fourth process, the wafer is diced by a diamond cutter to be a square crystal 102 7 mm square.

The crystal 102 has four sides as a diced face and two planes (the surface and the back) which is a high-density n-type layer 3.

(5) As a fifth process, the total five faces of the four sides which are the diced faces of the crystal and one (a surface on the side of the light receiving part on which the electrode 4 is formed later and Schottky barrier is formed) of the two high-density n-type layers 3 are polished to be a mirror finished surface. The high-density n-type layer 3 existing on the polished face is completely removed by the above polishing. After polishing to be a mirror finished surface, organic cleaning is performed.

(6) As a sixth process, paraffin is applied to a surface (a surface on which a back contact 5 is formed later) having the left high-density n-type layer 3 and a thermal diffusion layer protective film (a resist film) is formed. The applied film is provided for protecting from etchant to prevent the high-density n-type layer 3 from being etched in etching in the following eighth process.

Figure 3:
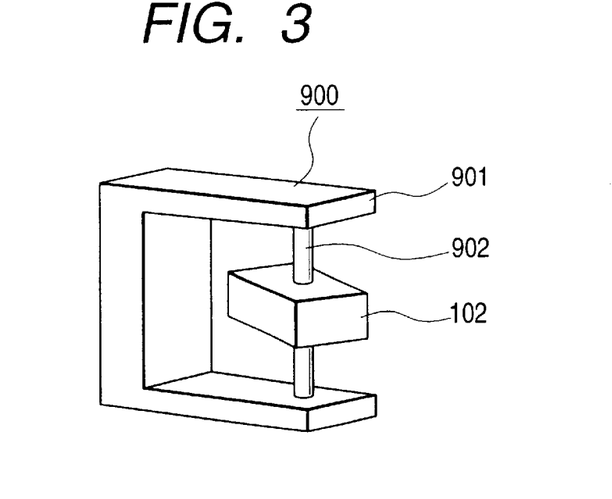
FIG. 3 is a perspective view schematically showing a detector fixer used in a process of removal of damaged layer and a process of passivation film fabrication of the manufacturing process according to the present invention.

(7) As a seventh process, the above crystal 102 is fixed to a fixer (or holder) shown in FIG. 3. The fixer 900 is made of teflon resin. The fixer is composed of a frame 901 in the shape of a letter C and a support rod 902 for holding and fixing the surface and the back of the semiconductor crystal 102.

(8) As an eighth process, a damaged layer by polishing of the crystal 102 fixed to the fixer 900 is removed by etching it using mixed liquid of acetic acid, hydrofluoric acid and nitric acid.

(9) As a ninth process, the thermal diffusion layer protective film (the resist film) formed on the surface having the high-density n-type layer 3 is partially left only on an electrode formed region in the center of the back and is removed from the other region. The thermal diffusion layer protective film left in the electrode formed region is a circular insular pattern 4 mm in diameter.

After the thermal diffusion layer protective film is partially removed as described above, cleaning by pure water and the removal of a natural oxide film by dilute hydrofluoric acid are performed, liquid acquired by dissolving polyimide in a solvent is applied to the four sides, the whole back on which the insular pattern of the thermal diffusion layer protective film is left and the periphery of the surface from which the high-density n-type layer 3 is removed in the prior polishing process, the liquid is heated at 100° C. for twenty minutes and a polyimide protective film 7 is formed.

The polyimide protective film 7 on the surface is formed in the periphery in the width of 0.1 to 0.5 mm in the shape of a frame except the electrode formed region in the center of the surface.

(10) As a tenth process, the crystal 102 is detached from the fixer with the side on which the polyimide protective film is formed caught with a tweezers made of teflon and the insular pattern of the thermal diffusion layer protective film is removed by organic cleaning using acetone. The polyimide protective film 7 applied on the thermal diffusion layer protective film is also simultaneously removed by lift off together with the above removal of the thermal diffusion layer protective film and a crystal face to be an insular electrode formed region is exposed in the center of the back.

(11) As an eleventh process, cleaning using pure water and the removal of a natural oxide film using dilute hydrofluoric acid are performed and gold electrodes 4 and 5 are formed by vacuum deposition. A mask 6 mm square having an opening the four corners of which are rounded using a circle 0.5 mm in radius is used for the formation of the electrode 4 on the side of the light receiving part and a mask 4 mm in diameter having a circular opening is used for the formation of the electrode 5 on the back to be a back contact.

When gold is deposited, the mask and the polyimide protective film are registered so that the center of the mask and the center of the opening of the polyimide protective film 7 are coincident and the periphery of the opening of the polyimide protective film 7 is protruded in the opening of the mask. The protruded width is in a range of 0.1 to 0.5 mm.

Therefore, in the formation of an electrode, the periphery of the electrode and the periphery of the polyimide protective film are mutually overlapped by 0.1 to 0.5 mm so that each periphery of both electrodes is a little expanded outside the electrode formed region in which a crystal face is exposed because of the opening of the polyimide protective film and covers the periphery of the polyimide protective film.

Schottky barrier is created on a contact surface between the surface of the silicon crystal 102 from which the high-density n-type layer 3 is previously polished and removed and the gold electrode 4 formed on the above surface. The surface of the gold electrode 4 configures the light receiving part on which x-ray is incident, the face having the high-density n-type layer 3 of the back configures a signal extracting face and an ohmic contact is generated between the above face and the electrode 5.

For the thickness of the electrode, each electrode is formed so that the electrode 4 on the side of the light receiving part is 20 nm thick and the electrode 5 on the reverse side is 0.5 $\mu$m thick. The polyimide protective film 7 is formed so that the thickness is 10 to 100 $\mu$m. The electrode 4 on the side of the light receiving part is expanded possibly because the above electrode also functions as a light receiving window for making a radiation effectively incident on a semiconductor crystal face on which Schottky barrier is generated and the thickness is thinned. The thickness of the back contact 5 is 0.5 $\mu$m, while the thickness of the electrode 4 on the side of the light receiving part is 20 nm and is extremely thin.

Figure 4:
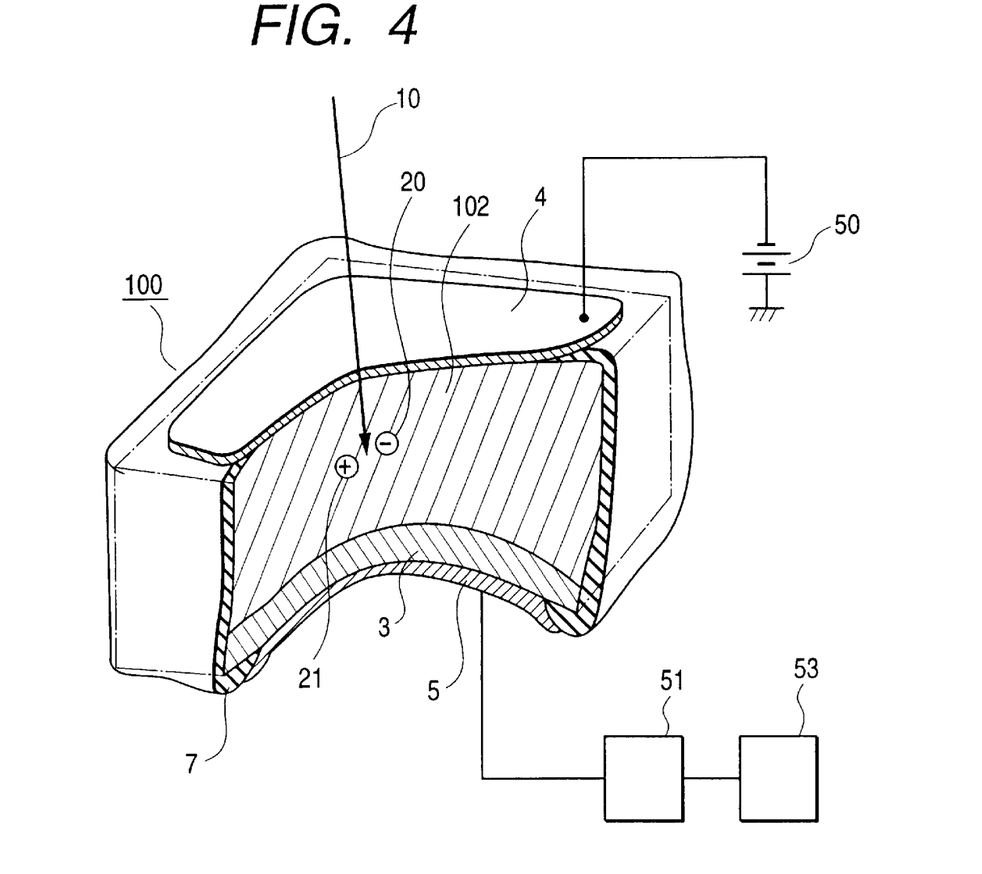
FIG. 4 is a schematic partial sectional perspective view showing the radiation detector according to the present invention and is also a schematic drawing showing an apparatus of radiation detection provided with the above detector.

FIG. 4 is a partial sectional perspective view showing the inside of the detector 100 produced as described above and the superficial structure and the configuration of the detector 100 is the same as that shown in FIG. 1B. Negative bias voltage is applied to the electrode 4 on the side of the light receiving part from a bias supply 50. When x-ray 10 is incident from the light receiving part, a pair of an electron 20 and a hole 21 is generated in a depletion layer generated inside the crystal 102 by the application of reverse bias, the electron 20 moves to the back contact 5 without recombination and is output outside as a signal, is amplified by a signal amplifier 51 and further, is analyzed by a pulse-height analyzer 53.

Figure 5:
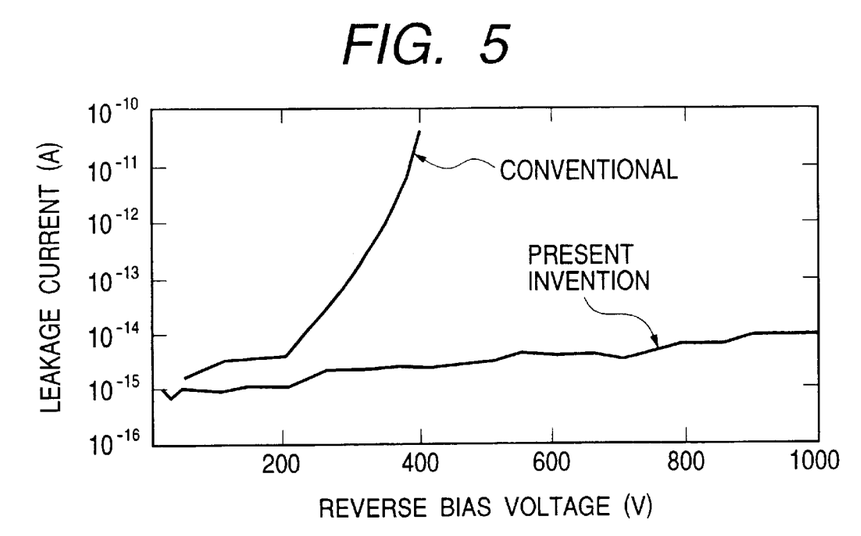
FIG. 5 is a graph showing comparison in current/voltage characteristics between the radiation detector according to the present invention and a conventional type radiation detector.

FIG. 5 is a graph showing the result of cooling the radiation detector 100 produced as described above using liquid nitrogen and checking the dependence of leakage current on reverse bias voltage. In FIG. 5, the characteristics acquired according to a prior method of the detector are also shown as an example for comparison.

The electrode 4 on the side of the light receiving part of the detector according to the present invention is necessarily overlapped with the periphery of the insulating passivation film 7, however, in the prior example for comparison, the electrode 4 and the periphery of the insulating passivation film 7 are not overlapped and they are only close.

In the prior example for comparison, a typical value of voltage at which leakage current rapidly increases, breakdown starting voltage is approximately 200 V. However, in the case of the present invention, breakdown starting voltage exceeds 200 V by far and at 1000 V, leakage current is $10^{-14}$ A, that is, is approximately 10 fA.

It is marvelous that when reverse bias voltage of 1000 V is applied, leakage current is also 100 fA or less. According to this embodiment, the detector having the above satisfactory characteristics is acquired at the yield of 90% or more.

It is guessed that the reason is that the surface of the semiconductor crystal is prevented from being directly touched to the other object and is held a surface on which a defect is a few by shifting the process for forming the insulating passivation film before the process for forming the electrode (that is, the process for forming the electrode is shifted after the process for forming the insulating passivation film.), which characterizes the present invention.

Second Embodiment

In this embodiment, the present invention is applied to a pin-type semiconductor radiation detector. The present invention is remarkably different from prior art in the most characteristic following two though the present invention is also different from prior art in that a crystal in size suitable for forming a detector is diced from a wafer after impurities required for the wafer are doped as described above. That is, a first point is that the order of a process for forming an insulating passivation film and a process for forming an electrode is reverse to the prior method and the process for forming the electrode is executed after the process for forming the insulating passivation film, and a second point is that the periphery of the electrode on the side of a light receiving part is necessarily overlapped with the periphery of the insulating passivation film.

Therefore, as for a pin-type detector, these points are also the same as the contents described in the first embodiment. It is in a process for forming a pin-type diode that the pin-type detector described in this embodiment is different from Schottky-barrier type detector.

However, as the pin-type diode can be manufactured in a well-known process, it is conceivable that special explanation is not required. The outline when the pin-type detector is manufactured will be described below.

First, a wafer 3 mm thick and 2 inches in diameter the orientation of the crystal face of which is (111) and which is diced from an ingot of a high-purity n-type silicon crystal the resistivity of which is approximately 50 k$\Omega$cm is used. Both surfaces of the diced wafer are polished to be a mirror finished surface.

"B+" is doped into the surface layer of the surface of the wafer (on the side of the light receiving part) shallowly by 5 keV by ion plantation. Also, "P+" is doped into the back (on the side of a back contact) by 30 keV by ion implantation. After it, annealing is performed, a high-density p-type layer is formed on the side of the surface of the wafer, a high-density n-type layer is formed on the back and hereby, the basic configuration of a pin-type diode is formed.

A pin crystal in size required for forming the detector is diced from the wafer. In this embodiment, the wafer is also diced into a square crystal 102 7 mm square as in the first embodiment.

Afterward, the four sides are polished as in the first embodiment.

Paraffin is respectively applied to the high-density p-type layer on the front surface and the high-density n-type layer on the back as a resist film. The resist film is provided to protect the high-density ptype layer and the high-density n-type layer from etchant when a damaged layer caused in a previous polishing process is removed in a later etching process.

The surface and the back of the crystal 102 are fixed to a fixer shown in FIG. 3, only an electrode formed region in the center of the resist film formed on the high-density p-type layer of the crystal 102 is left and the resist film in the periphery is removed in the width of 0.1 to 0.5 mm in the shape of a frame as in the ninth process in the first embodiment. As for the high-density n-type layer on the back, only the electrode formed region in the center is left as a circular insular pattern 4 mm in diameter and the resist film in the other region is removed.

Afterward, cleaning using pure water and the removal of a natural oxide film using dilute hydrofluoric acid are performed, liquid acquired by dissolving polyimide in a solvent is applied to the whole surface, the liquid is heated at 100° C. for twenty minutes and a polyimide protective film 7 is formed.

Next, as in the tenth process, the crystal 102 is detached from the fixer with the side on which the polyimide protective film is formed caught with a tweezers made of teflon and the resist pattern film on the surface and on the back is removed by organic cleaning using acetone. The polyimide protective film 7 applied on the resist pattern film is also simultaneously removed by lift off together with the above removal of the resist pattern film and a crystal face to be an electrode formed region on the surface and on the back is exposed.

Afterward, as in the eleventh process, the electrode 4 on the side of the light receiving part and the back contact 5 are formed as in the first embodiment. Hereby, the periphery of the electrode and the periphery of the polyimide protective film are mutually overlapped by 0.1 to 0.5 mm so that each periphery of both electrodes is a little expanded outside the electrode formed region in which a crystal face is exposed because of the opening of the polyimide protective film and covers the periphery of the polyimide protective film.

In the pin-type semiconductor radiation detector acquired as described above, breakdown starting voltage exceeds conventional 200 V by far and even if 1000 V is applied, leakage current is approximately $10^{-14}$ A, that is, 10 fA as Schottky-barrier type semiconductor radiation detector in the first embodiment.

Even if reverse bias voltage of 1000 V is applied, leakage current is 100 fA or less and a detector having the above satisfactory characteristics is acquired at the yield of 90% or more.

In the above second embodiment, the pin-type detector is described, however, as as for a pn-type detector, the similar effect is also acquired and the pn-type detector is the same as the case of the pin-type detector in principle, the description is omitted.

Third Embodiment

Figure 6:
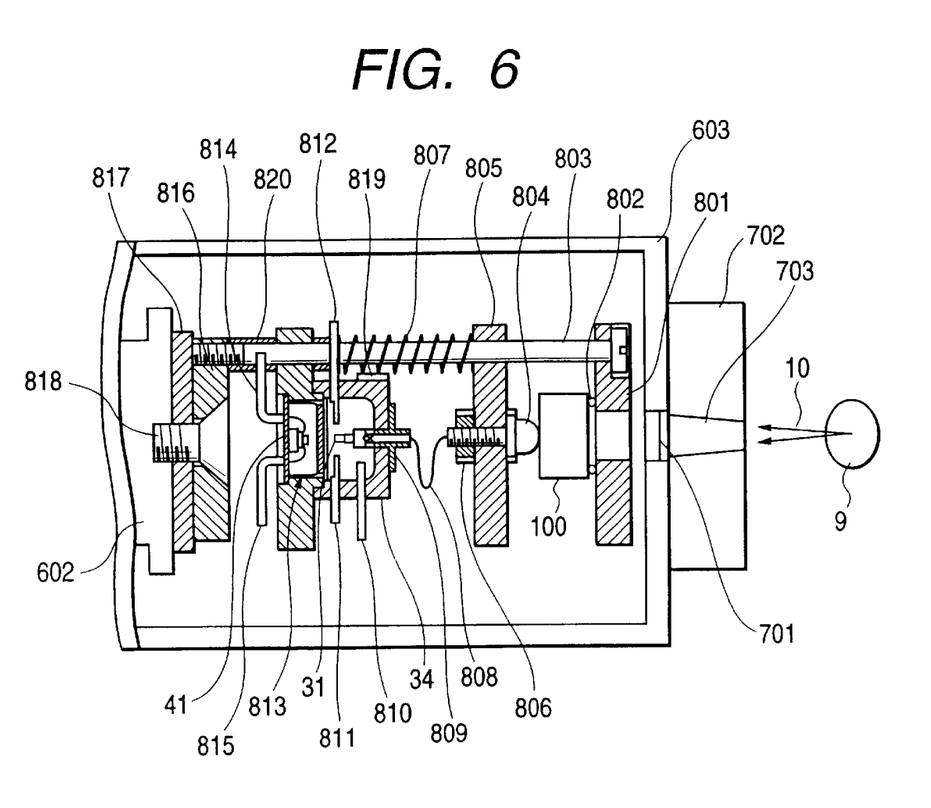
FIG. 6 is a sectional view showing an example in which the radiation detector according to the present invention is built in an apparatus of radiation detection.

FIG. 6 shows a detector of an apparatus of radiation detection using the detector produced as described above. A detector 100 on the front face of which Indium wire 802 which is soft metallic material is bonded is supported by a metal plate 801 provided with an x-ray window, a contact pin 804 fixed to an insulator plate 805 by a nut 806 for extracting a signal from the detector, a screw 803 and a spring 807.

Two screws 803 and two springs 807 are used. In FIG. 1, only each one is shown. The detector 100 can be held without being damaged by using the spring 807 and can be easily replaced in repair.

The contact pin 804 is connected to the gate pin 809 of a field effect transistor 31 installed inside a ceramic casing 34 via copper wire 808. The copper wire 808 is provided with enough length to move the insulator plate 805 when the detectors are replaced.

The ceramic casing 34 houses a light emitting diode 41 in addition to the field effect transistor 31. The light emitting diode 41 is housed in a metal casing 813. A feedback capacitor pin 810 is installed apart by approximately 0.5 mm from the gate pin 809 and a vacuum capacitor is formed between the feedback capacitor pin and the gate pin. The capacitance of the above capacitor actually measured is approximately 50 fF. A source pin 811 and a drain pin 812 are respectively connected to the source and the drain of the field effect transistor 31.

Further, outside the ceramic casing 34, a resistor 819 is bonded by an adhesive. The temperature of the ceramic casing can be adjusted by heat generated by making current flow to the resistor 819. That is, the ceramic casing is adjusted at temperature (approximately 150° C.) at which noise caused from the field effect transistor is minimum by adjusting the above current.

The ceramic casing 34 is fixed to a metal base 816 via a spacer 820 by the screw 803 and the spring 807. Space required by pins 814 and 815 for supplying power to the light emitting diode 41 is secured by the spacer 20. A screw 818 fixes the metal base 816 to a cooling rod 602 connected to a liquid nitrogen bath via the insulator plate 817. Hereby, the detector 100 and the field effect transistor 31 is cooled at low temperature.

An x-ray window 701 and an electron rejecter 702 are installed on the front face of a container 603. The electron rejecter 702 houses a permanent magnet and an electron beam from a specimen 9 is reflected by its magnetic field to prevent a reflected electron from being incident on the detector 100. Space in the container and space in which the specimen 9 exists are separated by the x-ray window 701. Hereby, even if the air enters space in which the specimen exists in replacing specimens, the air does not enter the container.

In the above embodiments, for the material of pins, gold is used, however, the material of pins is not particularly limited to gold and palladium and aluminum may be also used. A numerical value shown in this embodiment is an example and it hardly need be said that the detector is used without limiting to the numerical values. The square detector is described above, however, the contour is also not particularly limited and the detector may be also a polyhedron. Further, the examples in which the silicon crystal is used are shown, however, it hardly need be said that the present invention can be also applied to the manufacture of a germanium semiconductor radiation detector.

As described above, an expected object that voltage at which leakage current rapidly increases, breakdown starting voltage, sufficiently exceeds conventional 200 v and a reliable semiconductor radiation detector can be realized is achieved by the present invention.

What is claimed is:

1. A semiconductor radiation detector provided with diode structure configured by an electrode respectively provided both on the front and back surfaces of a crystal diced from a semiconductor wafer, an insulating passivation film covering at least the diced surfaces of the crystal, a pair of electrodes composed of a light receiving front electrode and a signal output back electrode for outputting a signal generated in said diode structure when a radiation is incident on said light receiving front electrode in a state in which reverse bias is applied between said both electrodes, wherein:

the shape of said crystal is polygonal;

at least the diced surfaces of the polygonal crystal diced from said semiconductor wafer have a mirror finished surface;

said insulating passivation film formed by coating a resin solution covers from said diced surface of the polygonal crystal to the periphery of said front and back surfaces so that said insulating passivation film surrounds the periphery of both the front and back surfaces of said polygonal crystal; and said light receiving front electrode is expanded from the main part of the electrode formed region at the front surface of said polygonal crystal to said insulating passivation film at the periphery so that the peripheries of insulating passivation film and said light receiving front electrode are mutually overlapped and laminated.

2. A semiconductor radiation detector according to claim 1, wherein:

said polygonal crystal is silicon; and diode structure is Schottky-barrier type.

3. A semiconductor radiation detector according to claim 1, wherein:

said polygonal crystal is silicon; and diode structure is a pin type.

4. (Amended) A semiconductor radiation detector according to claim 1, wherein:

said polygonal crystal is silicon; and diode structure is a pn type.

5. A semiconductor radiation detector according to claim 1, wherein:

the contour of said semiconductor radiation detector is a square.

6. A semiconductor radiation detector according to claim 1, wherein:

said insulating passivation film is composed of organic insulating material the main component of which is polyimide.

7. A semiconductor radiation detector according to claim 1, wherein:

said electrode is composed of any one kind of metal selected from the group consisting of gold, palladium and aluminum.

8. A semiconductor radiation detector according to claim 1, wherein:

said light receiving front electrode on the side of the light receiving part is provided with laminated structure that said front electrode covers from the light receiving part at the front surface of said polygonal crystal to said insulating passivation film at the periphery and the peripheries of said light receiving front electrode and said insulating passivation film are mutually overlapped in the width of 0.1 mm to 0.5 mm.

9. A manufacturing method of a semiconductor radiation detector provided with a process for polishing both of front and back surfaces of a semiconductor wafer, an etching process for removing damage due to polishing said surfaces, a process for doping impurities into a semiconductor wafer and forming a high-density layer, a process for dicing a crystal for forming said detector from said semiconductor wafer, a process for polishing the diced crystal, a process for removing the damaged layer due to the polishing of the diced surfaces of said crystal by etching, a process for forming an insulating passivation film by coating a resin solution on said diced and etched surfaces and on a periphery of an electrode formed region at said front and back surfaces of said crystal and a process for forming a pair of electrodes composed a light receiving front electrode and a signal output back electrode in said electrode formed region at the front and back surfaces of said crystal, wherein:

the process for dicing the crystal from said semiconductor wafer is a process for shaping a polygonal crystal, the process for polishing the diced crystal is a process for polishing at least said diced surfaces of the polygonal crystal to be a mirror finished surface, the process for forming the insulating passivation film by coating the resin solution on the surface of said polygonal crystal is processed as a preprocess of the process for forming a pair of electrodes in said electrode formed region, and the process forming said light receiving front electrode in said electrode formed region at the front surface of said polygonal crystal includes a process for covering the periphery of the insulating passivation film formed in the vicinity of said electrode formed region, mutually overlapping the periphery of said insulating passivation film and the periphery of said light receiving front electrode and forming laminated structure.

10. A manufacturing method of a semiconductor radiation detector according to claim 9, wherein:

in the process for forming laminated structure by mutually overlapping the periphery of said insulating passivation film and the periphery of said light receiving front electrode, mutually overlapped width is set to from 0.1 mm to 0.5 mm.

11. A manufacturing method of a pin-type semiconductor radiation detector provided with a process for polishing to be mirror finished surface both front and back surfaces of a high-purity n-type silicon semiconductor wafer, an etching process for removing damage due to polishing said surfaces, a process for doping impurities into both surfaces of said semiconductor wafer and forming a high-density layer, a process for dicing a crystal from said semiconductor wafer, a process for polishing the diced surfaces of said crystal, polishing said high-density layer of the front surface and removing it, a process for removing the damaged layer due to the polishing of the diced surfaces and the front surface by etching, a process for forming an insulating passivation film by coating a resin solution from said diced and etched surfaces to on a periphery of an electrode formed region said front and back surfaces of the crystal and a process for forming a pair of electrodes composed a light receiving front electrode and a signal output back electrode in said each electrode formed region so that Schottky barrier is formed between said light receiving front electrode and said front surface of the crystal and an ohmic contact is formed between said signal output back electrode and said back surface of the crystal, wherein:

the process for dicing the crystal from said semiconductor wafer is a process for dicing a polygonal shaped crystal for forming said detector in the shape of a polygon, the process for polishing the diced surfaces of the polygonal shaped crystal is a process for polishing at least said diced surfaces of the polygonal crystal to be a mirror finished surface, the process for forming the insulating passivation film by coating the resin solution on the surface of said polygonal crystal is processed as a preprocess of the process for forming a pair of electrodes in said electrode formed region, and the process for forming said light receiving front electrode in said electrode formed region at the front surface of the polygonal crystal includes a process for covering the periphery of the insulating passivation film formed in the vicinity of said electrode formed region, mutually overlapping the periphery of said insulating passivation film and the periphery of said light receiving front electrode and forming laminated structure.

12. A manufacturing method of a semiconductor radiation detector according to claim 11, wherein:

in the process for mutually overlapping the periphery of said insulating passivation film and the periphery of said light receiving front electrode and forming laminated structure, mutually overlapped width is set to from 0.1 mm to 0.5 mm.

13. An apparatus of radiation detection provided with a holder for holding a semiconductor radiation detector and a cryostat for cooling said fixer, wherein:

said semiconductor radiation detector comprises a polygonal crystal diced from a semiconductor wafer having either of the p-i-n or P-n or Schottky barrier diode structure;

the side surfaces of said diced polygonal crystal adopted by mirror-polishing;

a pair of electrodes composed of a light receiving electrode and a signal output electrode on the front and back surfaces of said polygonal crystal;

an insulating passivation film continuously formed by coating a resin solution from said side surfaces of the diced polygonal crystal to the periphery of said front and back surfaces of said diced crystal;

the periphery of said light receiving front electrode covers the periphery of said insulating passivation film on the front surface of the polygonal crystal so that the peripheries of said light receiving electrode and said insulating passivation film on the front surface of the polygonal crystal are mutually overlapped and laminated.

14. An apparatus of radiation detection according to claim 13, wherein:

said semiconductor radiation detector is Schottky-barrier type semiconductor radiation detector.

* * * * *